United States Patent [19]
Baqai

[11] Patent Number: 5,428,654
[45] Date of Patent: Jun. 27, 1995

[54] UP/DOWN COUNTER APPARATUS

[75] Inventor: Imran Baqai, Austin, Tex.

[73] Assignee: Advanced Micro Devices, Inc., Sunnyvale, Calif.

[21] Appl. No.: 257,543

[22] Filed: Jun. 9, 1994

[51] Int. Cl.$^6$ ............................................. H03K 21/16
[52] U.S. Cl. ......................................... 377/34; 377/45; 377/47
[58] Field of Search ............... 377/34, 47, 51, 118, 377/119, 120, 45

[56] References Cited

U.S. PATENT DOCUMENTS

| | | | |
|---|---|---|---|
| 3,349,332 | 10/1967 | Bleickardt | 377/34 |
| 4,606,059 | 8/1986 | Uida | 377/47 |
| 4,618,849 | 10/1986 | Bruestle | 340/347 |
| 4,780,894 | 10/1988 | Watkins et al. | 377/34 |
| 5,020,082 | 5/1991 | Takeda | 377/47 |
| 5,062,126 | 10/1991 | Radys | 377/51 |
| 5,097,491 | 3/1992 | Hall | 377/34 |
| 5,164,968 | 11/1992 | Otto | 377/34 |

Primary Examiner—John S. Heyman
Attorney, Agent, or Firm—Foley & Lardner

[57] ABSTRACT

An apparatus for counting occurrences of a particular input during a plurality of succeeding periods. The apparatus comprises an input terminal four receiving the input, a toggle signal generating circuit for generating a periodic toggle signal to mark the plurality of periods, and a plurality of n counter cell circuits for effecting the counting in n bits. Each counter cell circuit generates at least a respective bit output, a respective toggle output, and respective carry output. The counter cell circuits are arranged in hierarchical order from a least-significant counter cell circuit to a most-significant counter cell circuit. Each of the respective counter cell circuits is coupled with the next-most-significant counter cell circuit and provides the respective toggle output to the next-most-significant counter cell circuit as a respective toggle input, providers he respective carry/output to the next most-significant counter cell circuit as the respective carry input, except the most-significant counter cell circuit n receives its respective toggle input from the respective carry output of the twice-less-significant counter cell circuit cell circuit n-2.

13 Claims, 10 Drawing Sheets

UP/DOWN COUNTER APPARATUS

BACKGROUND OF THE INVENTION

There are occasions when it is appropriate to count up or down from a starting point in a counting scheme, rather than counting an absolute value of occurrences. One example of such an occasion is encountered in telephone switching, such as ground key switching operations.

In ground key switching operations, a telephone exchange grounds the TIP circuit to the central office to indicate a desire to communicate after any required handshake operation is completed. This is part of normal telephone system central office (PBX) communications using TIP and RING lines.

Ground key switch bounce occurs because of noise occasioned by the switch operation. Switch bounce is generally handled by introducing a delay in the switch operation to allow the switched signal to settle out after switch actuation. Ground key bounce is also complicated by the presence of AC noise which may be induced in the telephone system from power lines or other radiant electromagnetic source. Such induced AC noise is not uncommon since the telephone lines in the telephone system may be one to two miles long, or even longer. Thus, the telephone lines often encounter many environmental opportunities for induction of AC noise.

The signal induced on telephone lines from AC noise is not usually a full-wave AC signal. Normally, such induced AC noise is nearly half-rectified signal because when one telephone line (TIP or RING) of the telephone system is grounded, only one amplifier of the system is working. The system can only source current, it cannot sink current. Thus, such an induced AC signal is difficult to filter and any filtering will yield a DC offset in the filter output. Therefore, simply crossing a threshold in a ground key actuation is not a true indication of triggering (i.e., ground key operation).

However, noting that a threshold value (such as a threshold voltage) has been surpassed and has remained surpassed for a predetermined time can be a true indication of triggering despite the presence of an induced DC signal from filtering operations. Since the frequency of a telephone system is usually specified and is therefore known (50 Hz in Europe, 60 Hz in the United States), counting time intervals established by line voltage effects the required timed counting. Triggering may be considered to have occurred, for example, when a count exceeds a predetermined amount over a predetermined number of time periods. An up/down counter is particularly useful in such situations.

A gray code counter is one type of up/down counter which provides for switching one individual bit for each up- or down-count. For example, a three-bit gray code counter would count as follows:

```
0 0 0        
0 0 1        
0 1 1        
0 1 0  [+]   
1 1 0  [−]   
1 1 1        
1 0 1        
1 0 0        
0 0 0  [+]   
* * *        
* * *        
* * *        
```

In the above example, the counting scheme is structured to treat the most significant (third) bit as a "sign" bit. That is, the most significant bit changes from 0 to 1 as one counts from positive to negative and vice versa. The counter is cyclical, so one must provide enough bits for the gray code counter to prevent counting "around" into negative or positive "territory". Such a safeguard against cyclical counting can be designed by one skilled in the art because one knows for a given application the count intervals to be anticipated, the frequency of the signals to be counted, and similar parameters which will dictate the range of counting required for the particular application.

Gray code counters are known. However, prior art gray code suffers from the design shortcomings of many other circuits: inefficient layout, non-modular design requiring major redesign for accommodating a greater counting capacity, high part count, and similar general design characteristics.

Therefore, there is a need for a gray code up/down counter which is modular in design to accommodate ease of adding counting capacity to n bits, which is layout-efficient in its occupancy of "real estate" when embodied in silicon; and which has a lesser part count than previously encountered in gray code up/down counters.

SUMMARY OF THE INVENTION

An apparatus is disclosed for counting occurrences of a particular input during a plurality of succeeding periods. The apparatus comprises an input terminal for receiving the input, a toggle signal generating circuit for generating a periodic toggle signal to mark the plurality of periods, and a plurality of n counter cell circuits for effecting the counting in n bits. Each respective counter cell circuit generates at least a respective bit output, a respective toggle output, and respective carry output. The plurality of counter cell circuits are arranged in hierarchical order from a least-significant counter cell circuit for counting a least-significant bit to a most-significant counter cell circuit for counting a most-significant bit. Each of the respective counter cell circuits is coupled with the next-most-significant counter cell circuit and provides the respective toggle output to the next-most-significant counter cell circuit as a respective toggle input, provides the respective carry output to the next most-significant counter cell circuit as the respective carry input, except the most-significant counter cell circuit n receives its respective toggle input from the respective carry output of the twice-less-significant counter cell circuit n-2.

The least-significant respective counter cell circuit is coupled with the toggle signal generating circuit and receives the toggle signal from the toggle signal generating circuit as its respective toggle input and its respective carry input. The least-significant respective counter cell circuit is coupled with the input terminal and receives the input.

It is, therefore, an object of the present invention to provide an apparatus for counting occurrences of particular input during a plurality of succeeding periods which is modular in construction to accommodate counting up to n-bits.

It is a further object of the present invention to provide an apparatus for counting occurrences of a particular input during a plurality of succeeding periods which is layout-efficient in its occupancy of area, or "real estate", when embodied in silicon.

Still a further object of the present invention is to provide an apparatus for counting occurrences of a particular input during a plurality of succeeding periods which has a lower part count than prior art apparatus.

Further objects and features of the present invention will be apparent from the following specification and claims when considered in connection with the accompanying drawings illustrating the preferred embodiment of the invention.

DETAILED DESCRIPTION OF THE INVENTION

Figure 1:
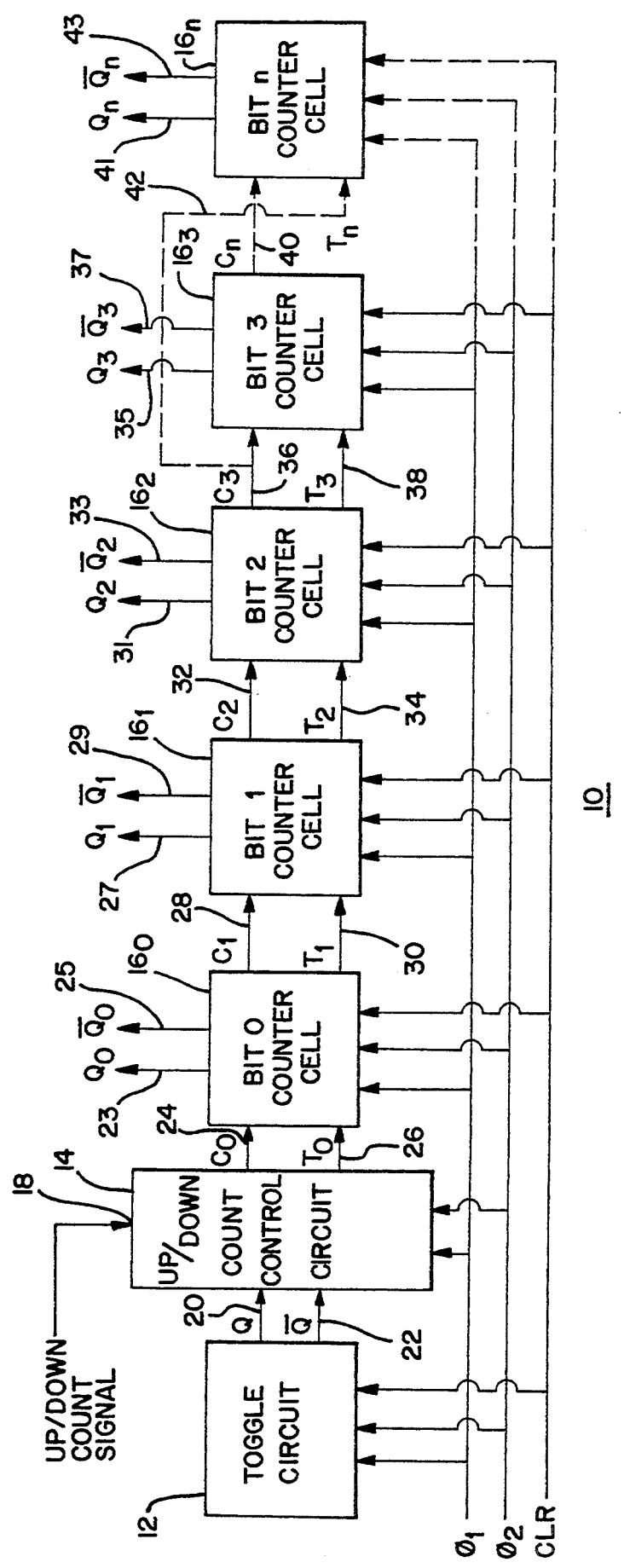
FIG. 1 is a block diagram of the preferred embodiment of an n-bit gray code counter.

FIG. 1 is a block diagram of the preferred embodiment of an n-bit gray code counter. In FIG. 1 a gray code counter 10 is illustrated as including a toggle circuit 12, an up/down counter control circuit 14, and bit counter cells $16_0$, $16_1$, $16_2$, $16_3$ and $16_n$. Two clock signals $\theta_1$ and $\theta_2$ are provided to each of the units of the gray code counter 10: toggle circuit 12, up/down current control circuit 13, and bit counter cells 16. Also provided to up/down counter control circuit 14 is an up/down count signal provided at an input 18. A clear signal CLR is also provided to the various units of gray code counter 10.

Toggle circuit 12 generates a toggle output comprising a toggle signal Q at an output 20 and an inverse toggle output $\overline{Q}$ (the inverse of toggle signal Q) at an output 22. Up/down counter control circuit 14 generates a bit 0 carry signal $C_0$ at an output 24 and a bit 0 toggle signal $T_0$ at an output 26. Bit 0 carry signal $C_0$ and bit 0 toggle signal $T_0$ are provided to bit 0 counter cell $16_0$ and, in a manner to be described in greater detail hereinafter in connection with FIG. 9, bit 0 counter cell $16_0$ generates a bit 0 count signal $Q_0$ at an output 23 and a bit 0 inverse count signal $\overline{Q}_0$ at an output 25. Bit 0 counter cell $16_0$ generates a bit 1 carry signal $C_1$ at an output 28 and generates a bit 1 toggle signal $T_1$ at an output 30. Bit 1 counter cell $16_1$ generates a bit 1 count signal $Q_1$ at an output 27 and generates an inverse bit 1 count signal $\overline{Q}_1$ at an output 29.

Bit 1 counter cell $16_1$ generates a bit 2 carry signal q at an output 32 and generates a bit 2 toggle signal $T_2$ at an output 34. Bit 2 counter cell $16_2$ receives bit 2 carry signal $C_2$ and bit 2 toggle signal $T_2$, generates a bit 2 count signal $Q_2$ at an output 31, and generates a bit 2 inverse count signal $\overline{Q}_2$ at an output 33.

Bit 2 counter cell $16_2$ also generates a bit 3 carry signal $C_3$ at an output 36 and a bit 3 toggle signal $T_3$ at an output 38. Bit 3 counter cell $16_3$ receives bit 3 carry signal $C_3$ and bit 3 toggle signal $T_3$, generates a bit 3 count signal $Q_3$ at an output 35, and generates an inverse bit 3 count signal $\overline{Q}$ at an output 37. Bit 3 counter cell $16_3$ generates a bit n carry signal $C_n$ at an output 40. Bit n toggle signal $T_n$ is provided to bit n counter cell $16_n$ from output 36 via a line 42. Thus, bit n toggle signal $T_n$ is the same signal as bit 3 carry signal $C_3$. Bit n counter cell $16_n$ receives bit n carry signal $C_n$ and bit n toggle signal $T_n$, generates a bit n count signal $Q_n$ at an output 31, and generates an inverse bit n count signal $\overline{Q}_n$ at an output 33.

In FIG. 1, line 42, carrying bit n toggle signal $T_n$, and line 40, carrying bit n carry signal $C_n$, are illustrated as dotted lines to indicate that gray code counter 10 is a modular apparatus. Any number of bit counter cells 16 may be interposed intermediate bit 3 counter cell $16_3$ and bit n counter cell $16_n$ to provide a higher bit count gray code counter 10. The only restraint is that the final carry signal $C_n$ must be provided from the carry signal output of bit counter cell $16_{n-2}$ (in the illustration of FIG. 1, that is bit 3 carry signal $C_3$).

In order to facilitate understanding of the present invention, like elements will be identified by like reference numerals in the various drawings.

Figure 2:
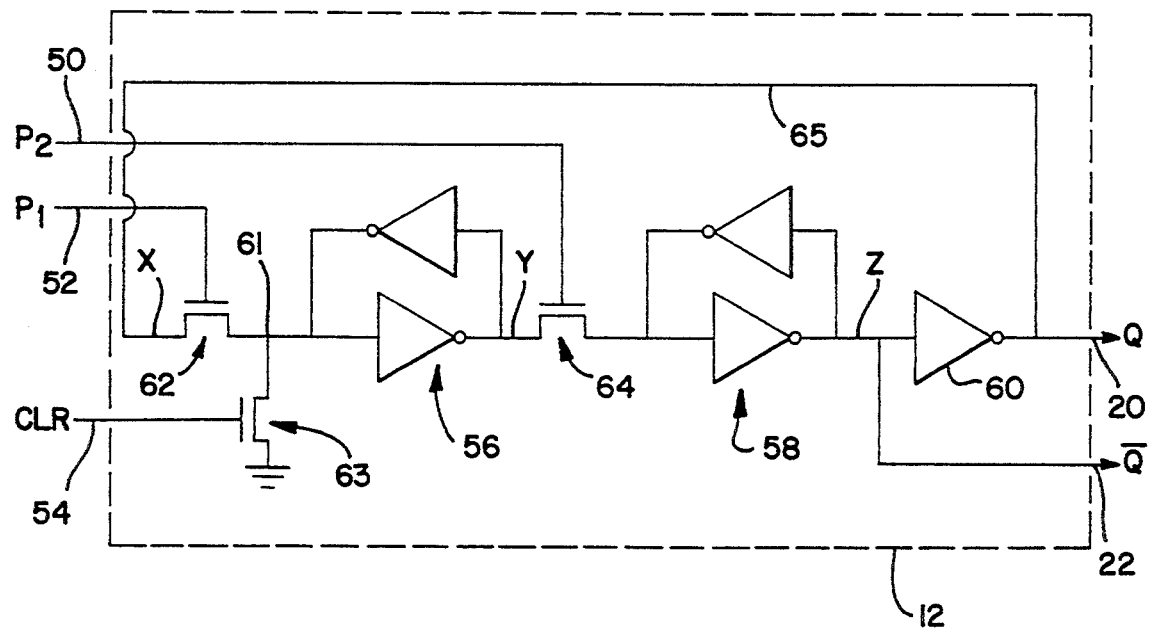
FIG. 2 is a schematic drawing of the preferred embodiment of the toggle circuit used in the counter illustrated in FIG. 1.

FIG. 2 is a schematic drawing of the preferred embodiment of the toggle circuit used in the counter illustrated in FIG. 1.

In FIG. 2, a toggle circuit 12 is illustrated as receiving a first clocking signal $\theta_1$ at an input 50 and a second clocking signal $\theta_2$ at an input 52. A clear signal CLR is provided at a clear signal input 54. Toggle circuit 12 is comprised of a first latch 56, a second latch 58, an inverter 60, and switching transistors 62, 64.

It is important to note that throughout the apparatus of the present invention, clocking signals $\theta_1$ and $\theta_2$ are non-overlapping clocking signals. The relation of clocking signals $\theta_1$, $\theta_2$ to the various aspects of the apparatus of the present invention will be described in greater detail hereinafter in connection with FIGS. 5–9.

Referring to FIG. 2, switching transistor 62 is responsive to clocking signal $\theta_2$ as a gating signal; switching transistor 64 is responsive to clocking signal $\theta_1$ as a gating signal. The output of second latch 58 is provided to inverse toggle signal output 22 for conveying inverse toggle signal $\overline{Q}$, and the output of inverter 60 is connected with toggle signal output 20 for conveying toggle signal Q. Toggle signal output 20 is also connected by a feedback line 65 to switching transistor 62. A further switching transistor 63 is responsive to clear signal CLR as a gating signal to ground the juncture 61 intermediate switching transistor 62 and first latch 56.

Figure 3:
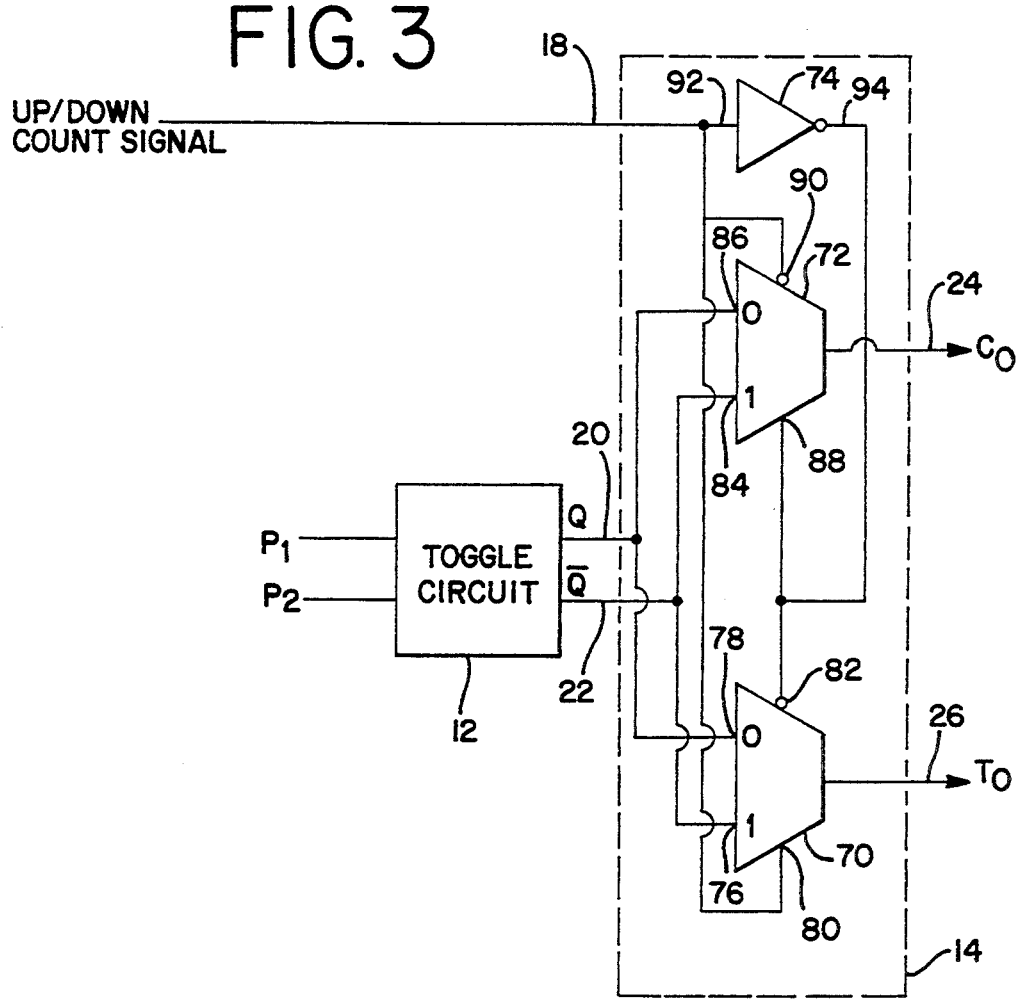
FIG. 3 is a schematic drawing of the preferred embodiment of an up/down count control circuit used in the counter illustrated in FIG. 1.

FIG. 3 is a schematic drawing of the preferred embodiment of an up/down counter control circuit used in the counter 15 illustrated in FIG. 1. In FIG. 3, an up/down counter control circuit 14 is connected with a toggle circuit 12 receiving a toggle signal Q on toggle signal output 20, and receiving an inverse toggle signal $\bar{Q}$ on inverse toggle signal output 22. Up/down counter control circuit 14, receives an up/down count signal via an input 18. Up/down counter control signal 14 comprises a first multiplexer 70, a second multiplexer 72, and an inverter 74.

First multiplexer 70 has a "1" input 76, a "0" input 78, a non-inverting trigger input 80, an inverting trigger input 2, and a bit 0 toggle output 26 for conveying bit 0 toggle signal $T_0$. Second multiplexer 72 has a "1" input 84, a "0" input 86, a non-inverting trigger input 88, an inverting trigger input 90, and bit 0 carry output 24 for conveying bit 0 carry signal $C_0$. Inverter 74 has an input 92 which receives the up/down signal from input 18. Inverter 74 provides an output 94 to noninverting trigger input 88 of second multiplexer 72 and to inverting trigger input 82 of first multiplexer 70. The up/down count signal received at input 18 is also provided to inverting trigger input 90 of second multiplexer 72 and to non-inverting trigger input 80 of first multiplexer 70. Toggle signal Q is provided to "0" input 86 of second multiplexer 72 and to "0" input 78 of first multiplexer 70. Inverse toggle signal $\bar{Q}$ is provided to "1" input 84 of second multiplexer 72 and to "1" input 76 of first multiplexer 70.

Figure 4:
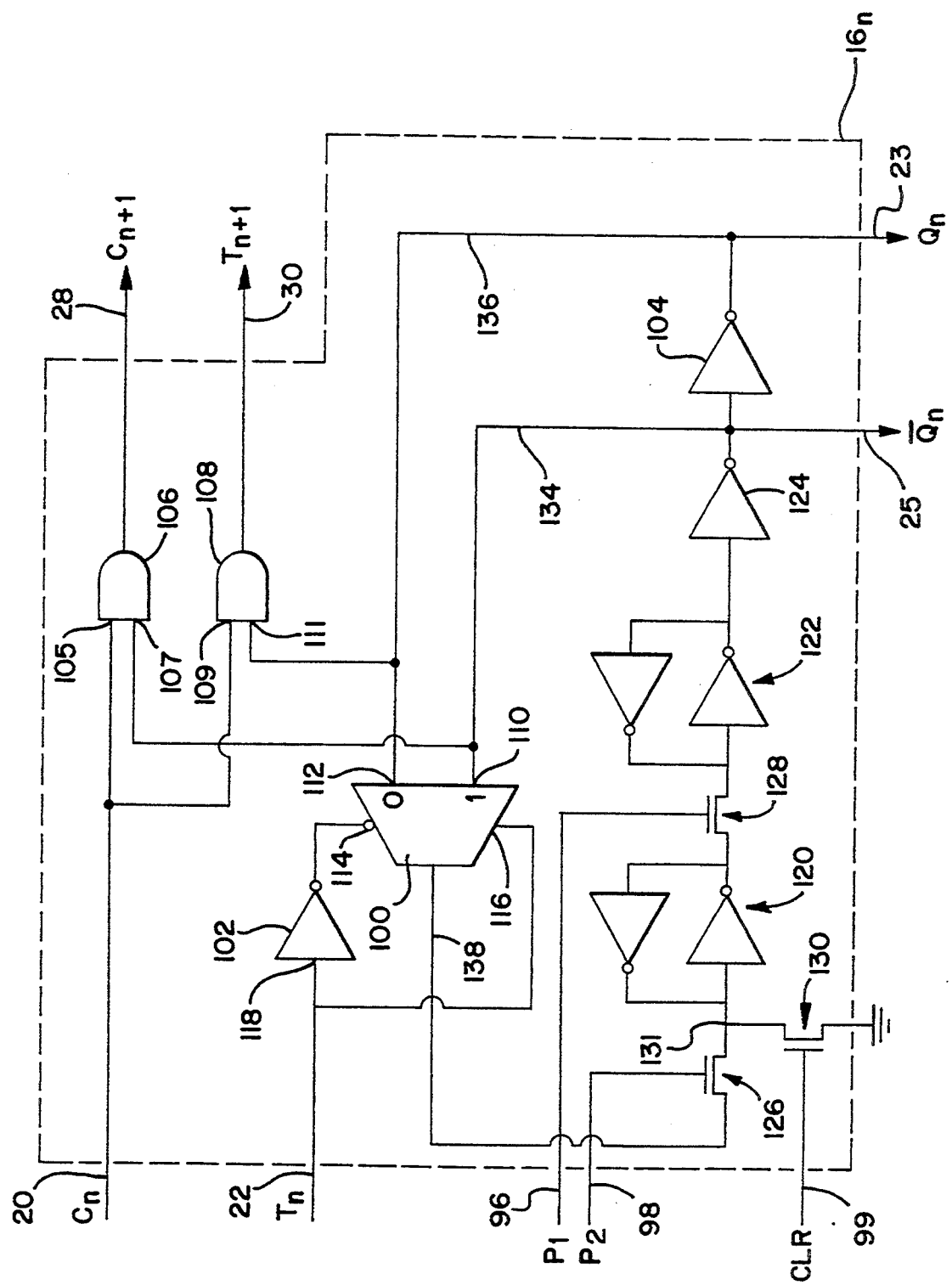
FIG. 4 is a schematic drawing of the preferred embodiment of a bit counter cell used in the counter illustrated in FIG. 1.

FIG. 4 is a schematic drawing of the preferred embodiment of a bit counter cell used in the counter illustrated in FIG. 1. Bit counter cell $16_n$ (for example, $16_0$) receives carry signal $C_n$ (e.g., $C_0$) via line 20 and receives toggle signal $T_n$ (e.g., $T_0$) via line 22. Clocking signal $\theta_1$, is received at an input 96 and clocking signal $\theta_2$ is received at an input 98. Clear signal CLR is received at an input 99. Bit n count signal $Q_n$ (e.g., $Q_0$) is provided at output 23, and inverse bit count signal $\bar{Q}_n$ (e.g., $\bar{Q}_0$) is provided at output 25. Carry signal $C_{n+1}$ (e.g., $C_1$) is provided at line 28 and toggle signal $T_{n+1}$ (e.g., $T_1$) is provided at output line 30.

Bit counter cell $16_n$ (e.g., $16_0$) includes a multiplexer 100, an inverter 102, an inverter 104, and AND gates 106, 108. AND gate 106 has a first input 105 and a second input 107. AND gate 108 has a first input 109 and a second input 111. The output of AND gate 106 is connected with line 28 and the output of AND gate 108 is connected with line 30. Multiplexer 100 has a "1" input 110 and a "0" input 112. Multiplexer 100 further has an inverting trigger input 114 and a non-inverting trigger input 116. Carry signal $C_n$ is received at input 105 of AND gate 106 and at input 109 of AND gate 108. Toggle signal $T_n$ is received at input 118 of inverter 102 and at non-inverting trigger input 116 of multiplexer 100. Bit counter cell $16_n$ further includes a latch 120, a latch 122, an inverter 124, and switching transistors 126, 128, 130. Switching transistor 126 responds to clocking signal $\theta_2$ received from input 98 as a gating signal; switching transistor 128 responds to clocking signal $\theta_1$ received from input 96 as a gating signal; switching transistor 130 responds to clear signal CLR received from input 99 as a gating signal to ground juncture 131. The output of inverter 124 is provided to output line 25 for conveying inverse bit n count signal $\bar{Q}_n$. Inverse bit n count signal $\bar{Q}_n$ is fed back via a feedback line 134 to "1" input 110 of multiplexer 100 and to input 107 of AND gate 106. The output of inverter 104 is provided to output line 23 for conveying bit n count signal $Q_n$. Bit n count signal $Q_n$ is fed back via a feedback line 136 to "0" input 112 of multiplexer 100 and to input 111 of AND gate 108. The output 138 of multiplexer 100 is connected with switching transistor 126 as illustrated in FIG. 4.

Figure 5:
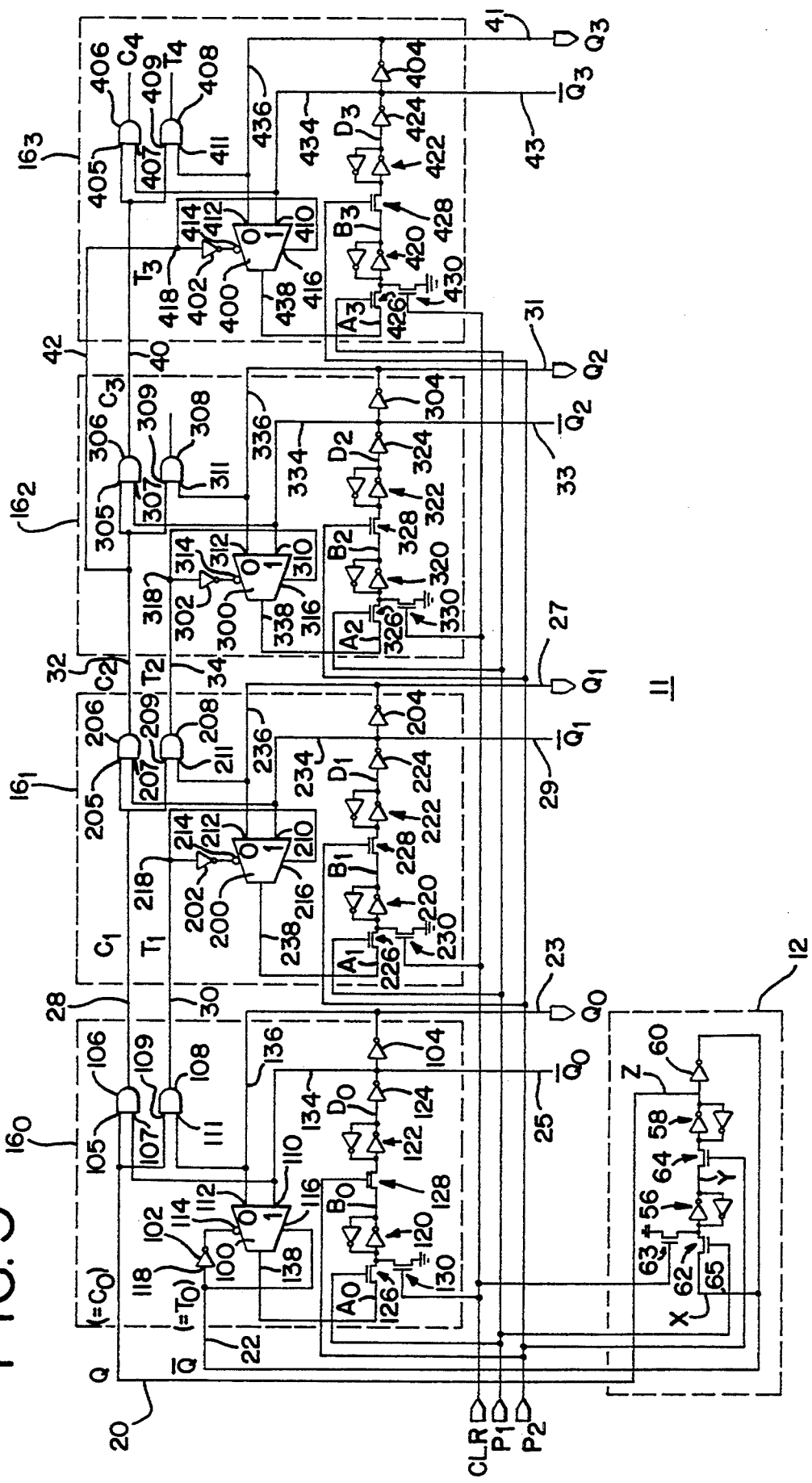
FIG. 5 is a schematic drawing of 4-bit gray code up-counter configured according to the preferred embodiment of the present invention.

FIG. 5 is a schematic drawing of a 4-bit gray code up-counter configured according to the preferred embodiment of the present invention. In order to facilitate understanding the present invention, the up/down counter control circuit (FIG. 1; FIG. 3) has been omitted from the counter of FIG. 5. The up-count configuration of the gray code counter of FIG. 5 is effected by toggle signal Q being employed as bit carry signal $C_0$ at input line 20 to bit counter cell $16_0$ and inverse toggle signal $\bar{Q}$ being employed as bit 0 toggle signal $T_0$ at input line 22 to bit counter cell 160. Thus, in FIG. 5, a 4-bit gray code up-counter 11 is comprised of a bit 0 counter cell $16_0$, a bit 1 counter cell $16_1$, a bit 2 counter cell $16_2$, a bit 3 counter cell $16_3$ and a toggle circuit 12. To further facilitate understanding of the present invention, like elements of each bit counter cell are identified by the same reference numeral as its adjacent bit counter cell, plus or minus 100. Inspection reveals that gray code counter 11 is comprised of four bit counter cells of the type illustrated in FIG. 4, and a toggle circuit of the type illustrated in FIG. 2. The detailed reference numeral scheme is incorporated to facilitate explanation of operation of up-counter gray code counter 11 in connection with timing diagrams presented in FIGS. 6a, 6b.

Figure 6A:
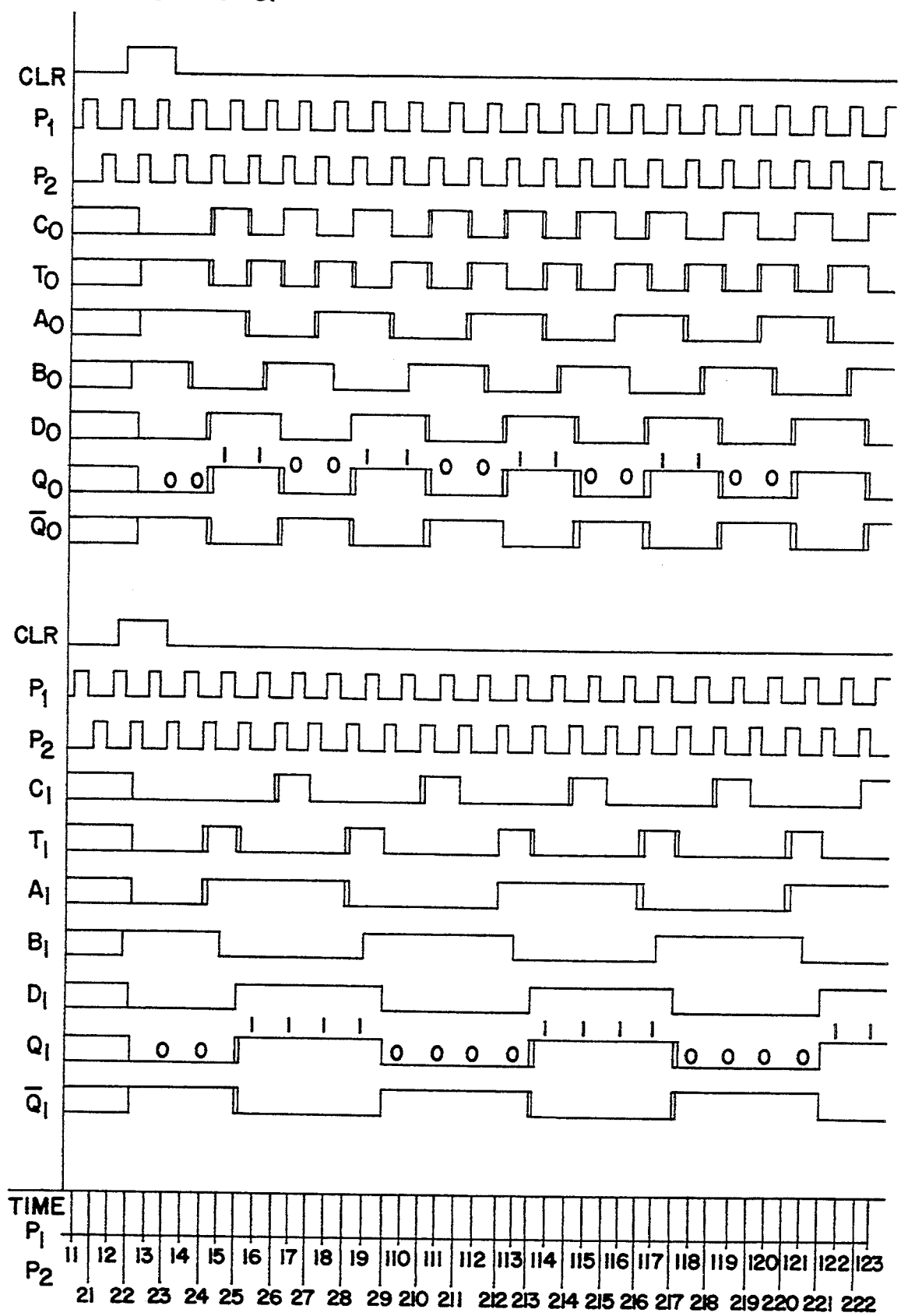
FIGS. 6a and 6b are timing signal diagrams relating to the operation of the up-counter illustrated in FIG. 5.

FIG. 6a begins at the top by providing a clear CLR signal and clocking signals $\theta_1$, $\theta_2$. Therebelow, bit 0 carry signal $C_0$ and bit 0 toggle signal $T_0$ are presented. Further therebelow, signals appearing at juncture $A_0$ (adjacent switching transistor 126), signals appearing at juncture $B_0$ (adjacent switching transistor 128), and signals appearing at juncture $D_0$ (adjacent inverter 124) are presented. Bit 0 count signal $Q_0$ and inverse bit 0 count signal $\bar{Q}_0$ are also presented.

FIG. 6a continues (in its lower portion) again presenting clear signal CLR and clocking signals $\theta_1$, $\theta_2$ for ease in following the timing of operation of gray code counter 11. Bit 1 carry signal $C_1$ and bit 1 toggle signal $T_1$ are presented, as well as signals appearing at juncture $A_1$ (adjacent switching transistor 226), signals appearing at juncture $B_1$ (adjacent switching transistor 228), and signals appearing at juncture $D_1$ (adjacent inverter 224). Bit 1 count signal $Q_1$ and inverse bit 1 count signal $\bar{Q}_1$ are also presented. Thus, FIG. 6a illustrates the timing signals appearing in bit 0 counter cell $16_0$ and bit 1 counter cell $16_1$. Similarly, FIG. 6b presents signals appearing in like loci in bit 2 counter cell $16_2$ and bit 3 counter cell $16_3$.

Figure 6B:
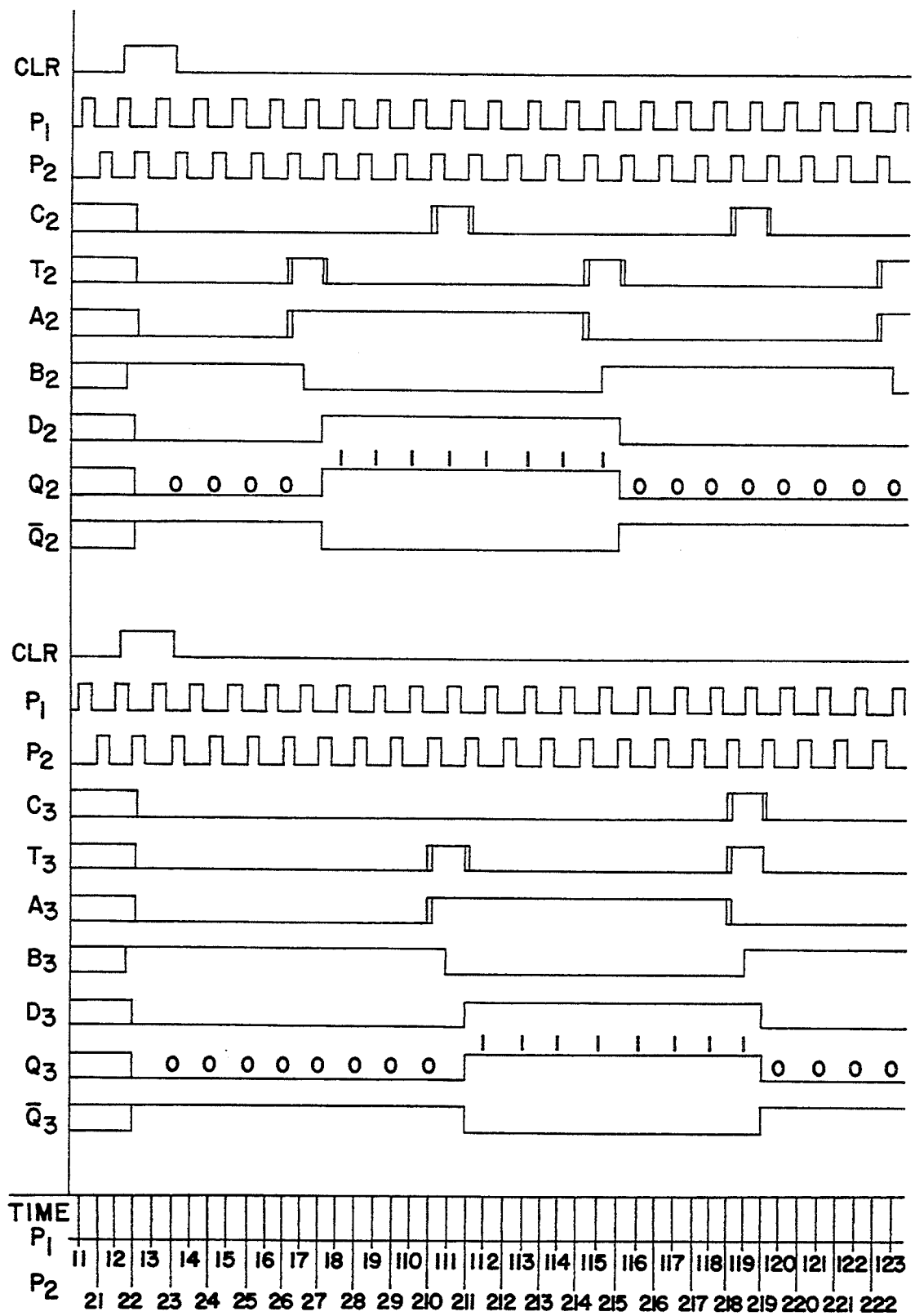

Referring to FIG. 5, and to FIG. 6a, 6b, immediately following the cessation of the clear signal CLR substantially at time 23 (FIG. 6a) bit 0 carry signal $C_0$ goes HIGH on the next occurring positive pulse of clock signal $\theta_2$ (time 24, FIG. 6a). At the same time (time 24) bit 0 toggle signal $T_0$ goes LOW. Bit 0 carry signal $C_0$ and bit 0 toggle signal $T_0$ are 180° out of phase thereafter. Juncture $A_0$ of bit counter cell $16_0$ is connected with output 138 of multiplexer 100. Thus, at time 24, when bit 0 carry signal $C_0$ is HIGH and bit 0 toggle signal $T_0$ is LOW, the signal appearing at non-inverting trigger input 114 of multiplexer 100 is HIGH and the signal appearing at non-inverting trigger input 116 of multiplexer 100 is LOW. In such a configuration, output 138 of multiplexer 100 is chosen from "0" input 112, so the signal appearing at output 138 is HIGH, thus the signal at juncture $A_0$ is HIGH. (For ease of understanding the present invention, certain propagation delays inherent in components in gray code counter 11 are ignored.) Thus, at time 24, the signal at juncture $B_0$ is LOW because of the intervening inverter associated with latch 120. The signal at juncture $D_0$ is HIGH because of the intervening inverter associated with latch 122. It should be noted that signals at juncture $D_0$ go HIGH in response to clocking signal $\theta_2$ gating switching transistor 128, and signals appearing at juncture $B_0$ go LOW upon the occasion of clocking signal $\theta_1$ gating switching transistor 126 (e.g., at time 14). The signal at juncture $D_0$ is inverted by inverter 124 so that inverse bit 0 count signal $\overline{Q}_0$ is LOW and is provided as a LOW signal to output line 25 as well as via feedback line 134 to "1" input 110 of multiplexer 100. Inverter 104 inverts the signal passing therethrough to result in bit 0 count signal $Q_0$ being HIGH. Thus, a HIGH signal is applied to output line 23 as well as to feedback line 136, and thence to "0" input 112 of multiplexer 100. Thus, when bit 0 toggle signal $T_0$ changes state at time 25 to a HIGH state, multiplexer 100 selects its "1" input 110 for application to output 138. "1" input 110 is LOW (the same as bit 0 count signal $\overline{Q}_0$) so that signals appearing at juncture $A_0$ are LOW, and signals at juncture $B_0$ shift to HIGH upon gating switching transistor 126 by clocking signal $\theta_1$ at time 16. Consequently, signals appearing at juncture $D_0$ shift to LOW upon the gating of switching transistor 128 by clocking signal $\theta_2$ at time 26. As a result, inverse bit 0 count signal $\overline{Q}_0$ switches to HIGH and bit 0 count signal $Q_0$ switches to LOW. On the next state change by bit 0 toggle signal $T_0$ (at time 26) multiplexer 100 applies its "0" input 112 to output 138. At this point in time (time 26) "0" input 112 of multiplexer 100 is LOW (see bit 0 count signal $Q_0$) so that signals at juncture $A_0$ remain LOW. Therefore, the signal at juncture $B_0$ is HIGH, the signal at juncture $D_0$ is LOW, bit 0 count signal $Q_0$ is LOW, and inverse bit 0 count signal $\overline{Q}_0$ is HIGH. At time 27, bit 0 toggle signal $T_0$ shifts to a HIGH state and, therefore, multiplexer 100 selects its output 138 from its "1" input 110. "1" input 110 at this time is HIGH, so signals appearing at juncture $A_0$ shift to a HIGH state.

Bit 0 counter cell $16_0$ continues operating in this manner until interrupted by clear signal CLR or some other occasion.

Thus, it can be seen that bit 0 count signal $Q_0$ is cycled during the up-count operation of up-count gray code counter 11 between a HIGH value for two time periods and a LOW value for two time periods.

Referring to the lower portion of FIG. 6a, timing signals relating to the operation of bit 1 counter cell $16_1$ (FIG. 5) are illustrated. Specifically, bit 1 carry signal $C_1$ is presented to bit 1 counter cell $16_1$ via line 28; bit 1 carry signal $C_1$ is the output of AND gate 106 in bit 0 counter cell $16_0$. Thus, bit 1 carry signal $C_1$ is HIGH whenever both bit 0 carry signal $C_0$ and inverse bit 0 count signal $\overline{Q}_0$ are HIGH. As a result, the occurrence of a bit 1 carry signal $C_1$ being HIGH is displaced by four time periods. (Bit 0 carry signal $C_0$ being HIGH is only separated by one time period.) Similarly, bit 1 toggle signal $T_1$ is provided to bit 1 counter cell $16_1$ via input line 30. Bit 1 toggle signal $T_1$ is the output of AND gate 108 of bit 0 counter cell $16_0$. Thus, bit 1 toggle signal $T_1$ is HIGH only when both bit 0 carry signal $C_0$ and bit 0 count signal $Q_0$ are HIGH. Accordingly, bit 1 toggle signal $T_1$ being HIGH is also separated by four time periods. (Bit 0 toggle signal $T_0$ being HIGH is separated by one time period.)

Bit 1 counter cell $16_1$ operates in the same manner as bit 0 counter cell $16_0$. However, the signals within bit 1 counter cell $16_1$ are different since bit 1 toggle signal $T_1$ is timed differently than bit 0 toggle signal $T_0$. Thus, bit 1 toggle signal $T_1$ is LOW following cessation of clear signal CLR until time 24 (at which time both bit 0 count signal $Q_0$ and bit 0 carry signal $C_0$ are HIGH in bit 0 counter cell $16_0$). Accordingly, until time 24, multiplexer 200 selects its "0" input 212 to apply to its output 238. Since, at the time clear signal CLR was imposed, the juncture intermediate switching transistor 226 and latch 220 was grounded through switching transistor 230, bit 1 count signal $Q_1$ is LOW. Therefore, "0" input 212 of multiplexer 200 is LOW. Accordingly, output 238 is LOW and the signal appearing at juncture $A_1$ is LOW. This condition continues until bit 1 toggle signal $T_1$ goes to a HIGH state (at time 24) then multiplexer 200 selects its "1" input 210 to apply to output 238. The signals appearing at juncture $A_1$ therefore go HIGH. Upon the next pulse of clocking signal $\theta_1$, switching transistor 226 is gated so that (following inversion by the inverter associated with latch 220) signals appearing at juncture $B_1$ shift LOW. Clocking signal $\theta_2$ gates switching transistor 228 (at time 25) so that signals appearing at juncture $D_1$ go HIGH. As a result, inverse bit 1 count signal $\overline{Q}_1$ goes LOW, and bit 1 count signal $Q_1$ goes HIGH. At time 25, bit 1 toggle signal $T_1$ shifts LOW so that multiplexer 200 selects its "0" input 212 for application to output 238. Since (at time 25) bit 1 count signal $Q_1$ is HIGH, output 238 is HIGH, and signals appearing at juncture $A_1$ remain HIGH. This condition continues until time 28 when bit 1 toggle signal $T_1$ goes HIGH. At that time, multiplexer 200 selects its "1" input 210 for application to output 238 so that output 238 goes LOW, and signals appearing at juncture $A_1$, go LOW. Bit 1 toggle signal $T_1$ shortly thereafter (at time 29) shifts LOW to cause multiplexer 200 to select its "0" input 212 to apply to output 238. By that time, bit 1 count signal $Q_1$ is LOW so that signals appearing at juncture $A_1$ remain LOW. Operation of bit 1 counter cell $16_1$ continues in this manner until interrupted either by a clear signal CLR or some other event. Thus, bit 1 count signal $Q_1$ remains HIGH for substantially four time periods and LOW for substantially four time periods in alternating patterns in up-counting gray code counter 11.

Referring to FIG. 6b, signals appearing in bit counter cells $16_2$ and $16_3$ are illustrated. Bit counter cells $16_2$ and $16_3$ operate in the same manner as bit counter cells $16_0$ and $16_1$. The difference in signals within these respective bit counter cells $16_2$, $16_3$ occur because of different patterns of occurrence of bit toggle signals $T_2$, $T_3$. For example, bit 2 carry signal $C_2$ is provided to bit 2 counter cell $16_2$ via a line 32, which is the output of AND gate 206 in bit 1 counter cell $16_1$. Accordingly, bit 2 carry signal $C_2$ is HIGH only when bit 1 carry signal $C_1$ is HIGH and inverse bit 1 count signal $\overline{Q}_1$ is HIGH. Bit 2 toggle signal $T_2$ is provided to bit 2 counter cell $16_2$ via line 34, which is the output of AND gate 208 in bit 1 counter cell $16_1$. Accordingly, bit 2 toggle signal $T_2$ is HIGH only when bit 1 carry signal $C_1$ is HIGH and bit 1 count signal $Q_1$ is HIGH. Thus, the occurrence of bit 2 toggle signal $T_2$ as a HIGH signal is separated by eight time periods. The operation of bit 2 counter cell $16_2$ is the same as earlier described in connection with bit counter cells $16_0$, $16_1$. In the interest of avoiding prolixity, a detailed description of the signals occurring within bit 2 counter cell $16_2$ is not undertaken here. Of importance is the result that a HIGH state of bit 2 count signal $Q_2$ occurs every eight time periods for a duration of eight time periods.

FIG. 6b also illustrates timing signals within bit 3 counter cell $16_3$. Of particular interest in regard to bit 3 counter cell $16_3$ is that bit 3 toggle signal $T_3$ is provided to bit 3 counter cell $16_3$ via a line 42 which branches directly from input line 32 carrying bit 2 carry signal $C_2$. Thus, bit 3 toggle signal $T_3$ is the same signal as bit 2 carry signal $C_2$. Bit 3 carry signal $C_3$ is provided to bit 3 counter cell $16_3$ via input line 40, which is the output of AND gate 306. Thus, bit 3 carry signal $C_3$ is HIGH only when bit 2 carry signal $C_2$ is HIGH and inverse bit 2 count signal $\overline{Q}_2$ is HIGH. The operation of bit 3 counter cell $16_3$ is the same as previously described in connection with the operation of bit counter cells $16_0$, $16_1$, $16_2$. The difference is that bit 3 toggle signal $T_3$ occurs differently in bit 3 counter cell $16_3$ than bit toggle signals $T_0$, $T_1$, $T_2$ occur in previously described bit counter cells $16_0$, $16_1$, $16_2$. In order to avoid prolixity, a detailed description of the operation of bit 3 counter cell $16_3$ will not be undertaken here. Bit 3 counter cell $16_3$ operates the same way that bit counter cells $16_0$, $16_1$ and $16_2$ operate. The occurrence patterns of bit 3 carry signal $C_3$ and bit 3 toggle signal $T_3$ differ from the occurrence patterns of analogous signals in the other bit counter cells $16_0$, $16_1$, $16_2$ because signals $C_3$, $T_3$ are outputs from AND gates 307 and 206, respectively. The important result of the counting action by bit 3 counter cell $16_3$ is that bit 3 count signal $Q_3$ is in a HIGH state for eight time periods separated by a LOW state for eight time periods.

A further relationship of importance among the bit counter cells $16_0$, $16_1$, $16_2$, $16_3$ is illustrated by inspection of FIGS. 6a, 6b. That is, the commencement of a HIGH portion of bit 1 count signal $Q_1$ occurs one time period following the commencement of a HIGH period of bit 0 count signal $Q_0$. Further, the commencement of a HIGH period of bit 2 count signal $Q_2$ occurs two time periods after commencement of a HIGH period of bit 1 count signal $Q_1$. Still further, the commencement of a HIGH portion of bit 3 count signal $Q_3$ occurs four time periods following the commencement of a HIGH period for bit 2 output signal $Q_2$. Thus, the structure of up-count gray code counter 11 (FIG. 5) and the resulting operating signals (FIGS. 6a, 6b) reveal that in a given succession of instants in time, up-count gray code counter 11 counts as follows:

| Time | $Q_0$ | $Q_1$ | $Q_2$ | $Q_3$ |
|---|---|---|---|---|
| 24 | 1 | 0 | 0 | 0 |
| 25 | 1 | 1 | 0 | 0 |
| 26 | 0 | 1 | 0 | 0 |
| 27 | 0 | 1 | 1 | 0 |
| 28 | 1 | 1 | 1 | 0 |
| 29 | 1 | 0 | 1 | 0 |
| 210 | 0 | 0 | 1 | 0 |
| 211 | 0 | 0 | 1 | 1 |
| 212 | 1 | 0 | 1 | 1 |
| 213 | 1 | 1 | 1 | 1 |
| 214 | 0 | 1 | 1 | 1 |
| 215 | 0 | 1 | 0 | 1 |
| 216 | 1 | 1 | 0 | 1 |
| 217 | 1 | 0 | 0 | 1 |
| 218 | 0 | 0 | 0 | 1 |
| 219 | 0 | 0 | 0 | 0 |
| 220 | 1 | 0 | 0 | 0 |
| 221 | 1 | 1 | 0 | 0 |
| 222 | 0 | 1 | 0 | 0 |

This is an up-count routine appropriate to a gray code counter wherein only one bit changes at a time. The count repeats after four bits ($2^4 = 16$ counts) for this 4-bit counter.

Figure 7:
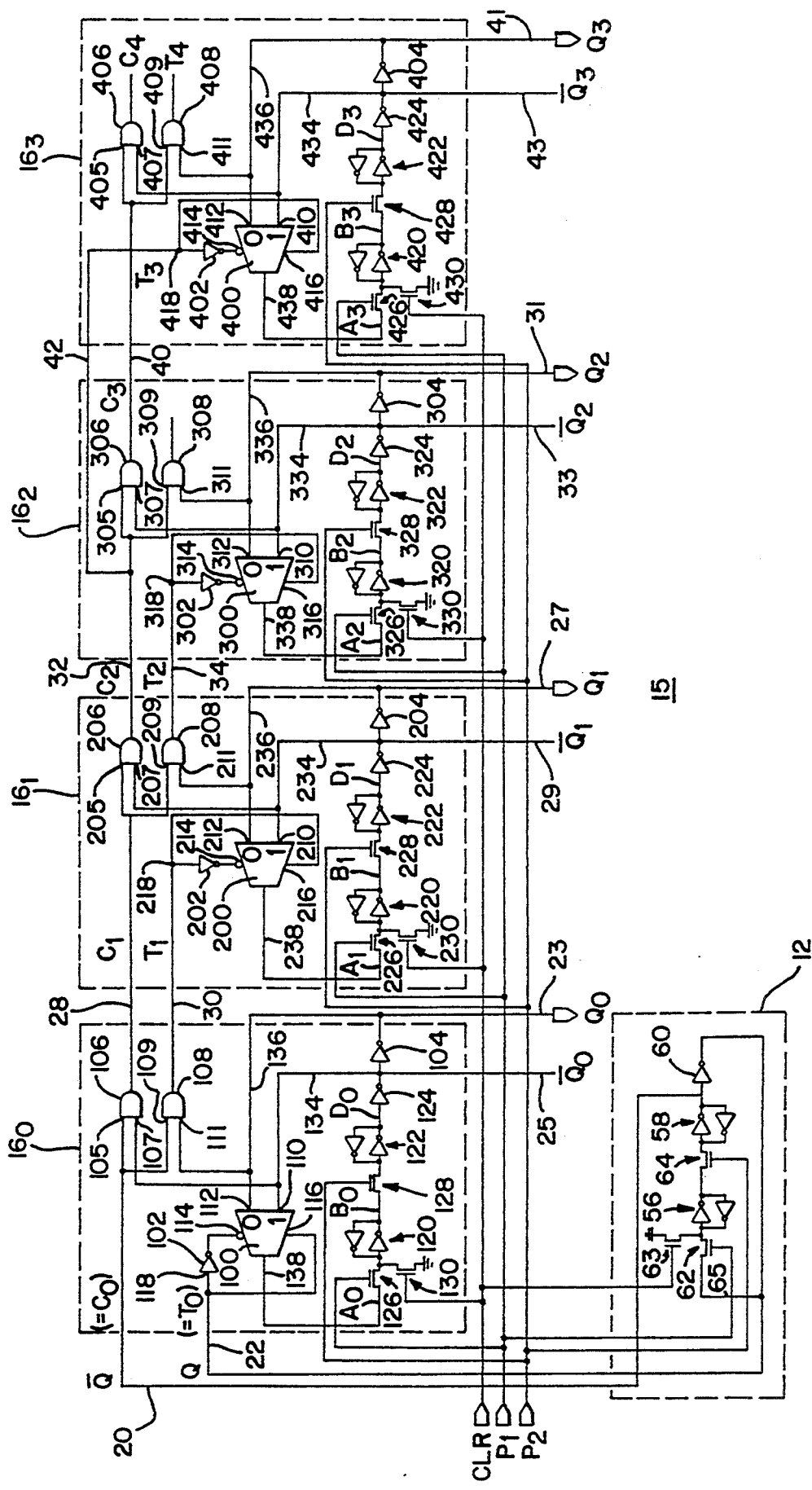
FIG. 7 is a schematic drawing of a 4-bit gray code down-counter configured according to the preferred embodiment of the present invention.

FIG. 7 is a schematic drawing of a 4-bit gray code down-counter configured according to the preferred embodiment of the present invention. In order to facilitate understanding the present invention, the up/down counter control circuit (FIG. 1; FIG. 3) has been omitted from the counter of FIG. 7. The down-count configuration of the gray code counter of FIG. 7 is effected by toggle signal $Q$ being employed as bit carry signal $C_0$ at input line 20 to bit counter cell $16_0$ and inverse toggle signal $Q$ being employed as bit 0 toggle signal $T_0$ at input line 22 to bit counter cell $16_0$. Thus, in FIG. 7, a 4-bit gray code down-counter 15 is comprised of a bit 0 counter cell $16_0$, a bit 1 counter cell $16_1$, a bit 2 counter cell $16_2$, a bit 3 counter cell $16_3$ and a toggle circuit 12. Inspection reveals that gray code counter 15 is comprised of four bit counter cells of the type illustrated in FIG. 4, and a toggle circuit of the type illustrated in FIG. 2. The detailed reference numeral scheme is the same numbering as is used in FIG. 5 and is incorporated to facilitate explanation of operation of down-counter gray code counter 15 in connection with timing diagrams presented in FIGS. 8a, 8b.

Figure 8A:
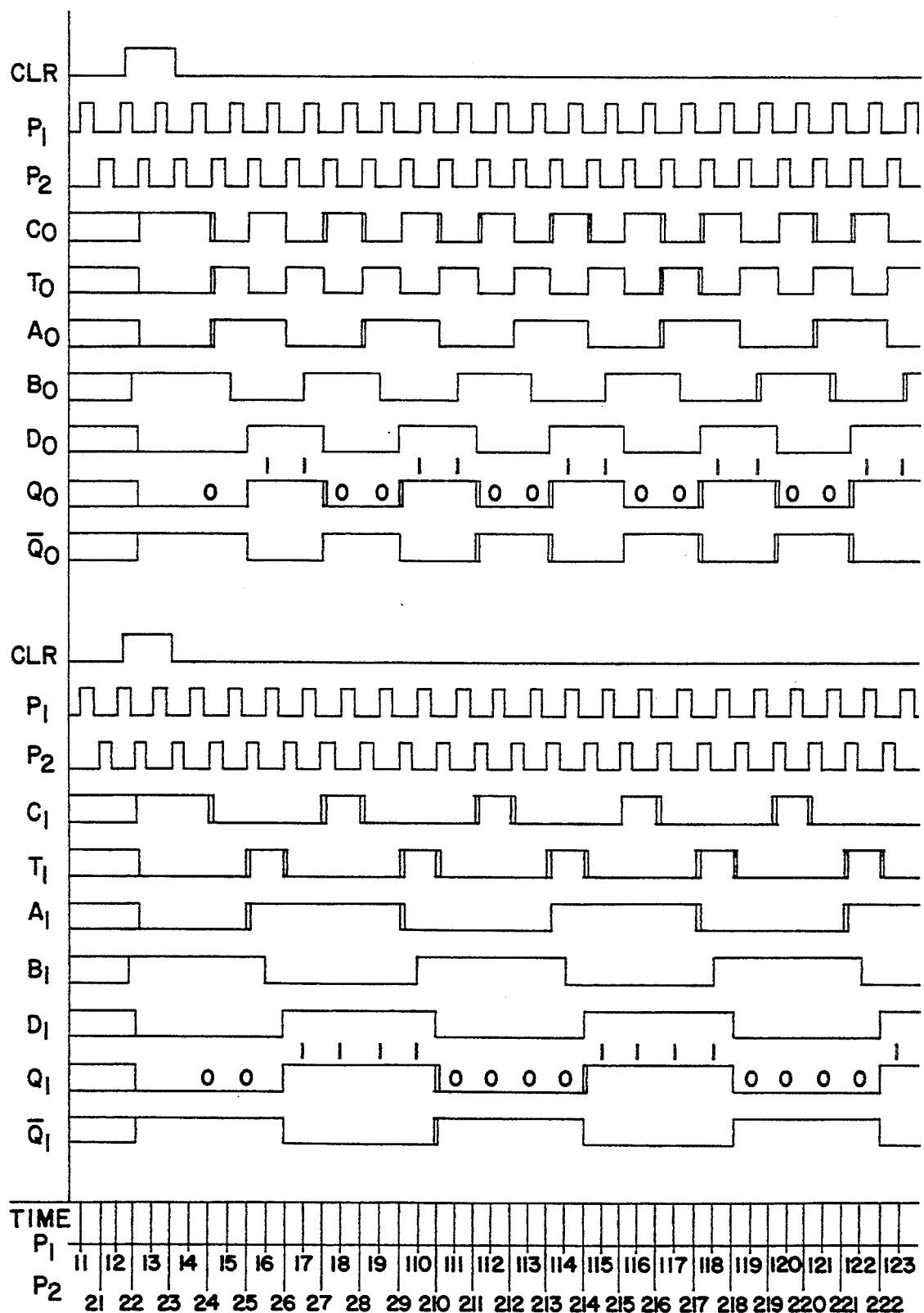
FIGS. 8a and 8b are timing signal diagrams relating to the operation of the down-counter illustrated in FIG. 7.

FIG. 8a begins at the top by providing a clear CLR signal and clocking signals $\theta_1$, $\theta_2$. Therebelow, bit 0 carry signal $C_0$ and bit 0 toggle signal $T_0$ are presented. Further therebelow, signals appearing at juncture $A_0$ (adjacent switching transistor 126), signals appearing at juncture $B_0$ (adjacent switching transistor 128), and signals appearing at juncture $D_0$ (adjacent inverter 124) are presented. Bit 0 count signal $Q_0$ and inverse bit 0 count signal $\overline{Q}_0$ are also presented.

FIG. 8a continues (in its lower portion) again presenting clear signal CLR and clocking signals $\theta_1$, $\theta_2$ for ease in following the timing of operation of down-count gray code counter 15. Bit 1 carry signal $C_1$ and bit 1 toggle signal $T_1$ are presented, as well as signals appearing at juncture $A_1$ (adjacent switching transistor 226), signals appearing at juncture $B_1$ (adjacent switching transistor 228), and signals appearing at juncture $D_1$ (adjacent inverter 224). Bit 1 count signal $Q_1$ and inverse bit 1 count signal $\overline{Q}_1$ are also presented. Thus, FIG. 8a illustrates the timing signals appearing in bit 0 counter cell $16_0$ and bit 1 counter cell $16_1$. Similarly, FIG. 8b presents signals appearing in like loci in bit 2 counter cell $16_2$ and bit 3 counter cell $16_3$.

Figure 8B:
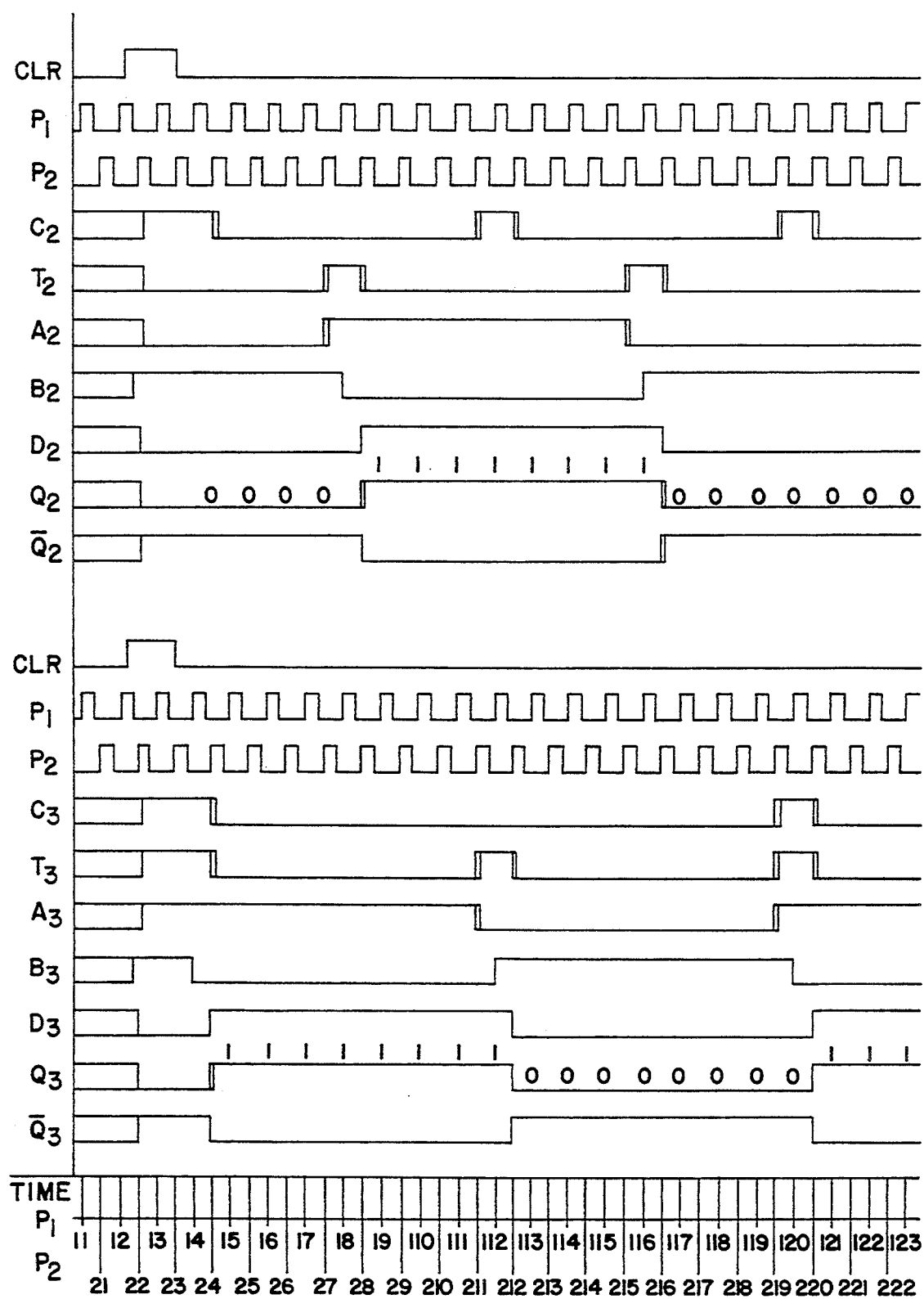

Referring to FIG. 7, and to FIG. 8a, 8b, immediately following the cessation of the clear signal CLR substantially at time 23 (FIG. 8a) bit 0 carry signal $C_0$ goes LOW on the next occurring positive pulse of clock signal $\theta_2$ (time 24, FIG. 8a). At the same time (time 24) bit 0 toggle signal $T_0$ goes HIGH. Bit 0 carry signal $C_0$ and bit 0 toggle signal $T_0$ are 180° out of phase thereafter. Juncture $A_0$ of bit counter cell $16_0$ is connected with output 138 of multiplexer 100. Thus, at time 24, when bit 0 carry signal $C_0$ is LOW and bit 0 toggle signal $T_0$ is HIGH, the signal appearing at non-inverting trigger input 114 of multiplexer 100 is LOW and the signal appearing at non-inverting trigger input 116 of multiplexer 100 is HIGH. In such a configuration, output 138 of multiplexer 100 is chosen from "1" input 110, so the signal appearing at output 138 is HIGH, thus the signal at juncture $A_0$ is HIGH. (For ease of understanding the present invention, certain propagation delays inherent in components in gray code counter 15 are ignored.) Thus, at time 24, the signal at juncture $B_0$ is HIGH; the signal at juncture $B_0$ will shift LOW after switching transistor 126 is gated by clocking signal $\theta_2$ (at time 15) because of the intervening inverter associated with latch 120. The signal at juncture $D_0$ will shift HIGH because of the intervening inverter associated with latch 122 after switching transistor 128 is gated by clocking signal $\theta_1$ (time 25). The signal at juncture $D_0$ is inverted by inverter 124 so that inverse bit 0 count signal $\overline{Q}_0$ is HIGH and is provided as a HIGH signal to output line 25 as well as via feedback line 134 to "1" input 110 of multiplexer 100. Inverter 104 inverts the signal passing therethrough to result in bit 0 count signal $Q_0$ being LOW. Thus, a LOW signal is applied to output line 23 as well as to feedback line 136, and thence to "0" input 112 of multiplexer 100. Thus, when bit 0 toggle signal $T_0$ changes state at time 25 to a LOW state, multiplexer 100 selects its "0" input 112 for application to output 138. "0" input 112 is HIGH (the same as bit 0 count signal $Q_0$) so that signals appearing at juncture $A_0$ are HIGH, and signals at juncture $B_0$ remain LOW. Consequently, signals appearing at juncture $D_0$ remain HIGH. As a result, inverse bit 0 count signal $\overline{Q}_0$ remains LOW and bit 0 count signal $Q_0$ remains HIGH. On the next state change by bit 0 toggle signal $T_0$ (at time 26) multiplexer 100 applies its "1" input 110 to output 138. At this point in time (time 26) "1" input 110 of multiplexer 100 is LOW (see inverse bit 0 count signal $\overline{Q}_0$) so that signals at juncture $A_0$ shift to LOW. The signal at juncture $B_0$ shifts to HIGH upon gating switching transistor 126 by clocking signal $\theta_1$ (time 17). The signal at juncture $D_0$ is HIGH, bit 0 count signal $Q_0$ is HIGH, and inverse bit 0 count signal $\overline{Q}_0$ is LOW. At time 27, bit 0 toggle signal $T_0$ shifts to a LOW state and, therefore, multiplexer 100 selects its output 138 from its "0" input 112. "0" input 112 at this time is LOW, so signals appearing at juncture $A_0$ remain LOW.

Bit 0 counter cell $16_0$ continues operating in this manner until interrupted by clear signal CLR or some other occasion.

Thus, it can be seen that bit 0 count signal $Q_0$ is cycled during the down-count operation of down-count gray code counter 15 between a HIGH value for two time periods and a LOW value for two time periods.

Referring to the lower portion of FIG. 8a, timing signals relating to the operation of bit 1 counter cell $16_1$ (FIG. 7) are illustrated. Specifically, bit 1 carry signal $C_1$ is presented to bit 1 counter cell $16_1$ via line 28; bit 1 carry signal $C_1$ is the output of AND gate 106 in bit 0 counter cell $16_0$. Thus, bit 1 carry signal $C_1$ is HIGH whenever both bit 0 carry signal $C_0$ and inverse bit 0 count signal $\overline{Q}_0$ are HIGH. As a result, the occurrence of a bit 1 carry signal $C_1$ being HIGH is displaced by four time periods. (Bit 0 carry signal $C_0$ being HIGH is only separated by one time period.) Similarly, bit 1 toggle signal $T_1$ is provided to bit 1 counter cell $16_1$ via input line 30. Bit 1 toggle signal $T_1$ is the output of AND gate 108 of bit 0 counter cell $16_0$. Thus, bit 1 toggle signal $T_1$ is HIGH only when both bit 0 carry signal $C_0$ and bit 0 count signal $Q_0$ are HIGH. Accordingly, bit 1 toggle signal $T_1$ being HIGH is also separated by four time periods. (Bit 0 toggle signal $T_0$ being HIGH is separated by one time period.)

Bit 1 counter cell $16_1$ operates in the same manner as bit 0 counter cell $16_0$. However, the signals within bit 1 counter cell $16_1$ are different since bit 1 toggle signal $T_1$ is timed differently than bit 0 toggle signal $T_0$. Thus, bit 1 toggle signal $T_1$ is LOW following cessation of clear signal CLR until time 25 (at which time both bit 0 count signal $Q_0$ and bit 0 carry signal $C_0$ are HIGH in bit 0 counter cell $16_0$). Accordingly, until time 25, multiplexer 200 selects its "0" input 212 to apply to its output 238. Since, at the time clear signal CLR was imposed, the juncture intermediate switching transistor 226 and latch 220 was grounded through switching transistor 230, bit 1 count signal $Q_1$ is LOW. Therefore, "0" input 212 of multiplexer 200 is LOW. Accordingly, output 238 is LOW and the signal appearing at juncture $A_1$ is LOW. This condition continues until bit 1 toggle signal $T_1$ goes to a HIGH state (at time 25) then multiplexer 200 selects its "1" input 210 to apply to output 238. The signals appearing at juncture $A_1$ therefore go HIGH. Upon the next pulse of clocking signal $\theta_1$, switching transistor 226 is gated so that (following inversion by the inverter associated with latch 220) signals appearing at juncture $B_1$ shift LOW. Clocking signal $\theta_2$ gates switching transistor 228 (at time 26) so that signals appearing at juncture $D_1$ go HIGH. As a result, inverse bit 1 count signal $\overline{Q}_1$ goes LOW, and bit 1 count signal $Q_1$ goes HIGH. At time 26, bit 1 toggle signal $T_1$ shifts LOW so that multiplexer 200 selects its "0" input 212 for application to output 238. Since (at time 26) bit 1 count signal $Q_1$ is HIGH, output 238 is HIGH, and signals appearing at juncture $A_1$ remain HIGH. This condition continues until time 29 when bit 1 toggle signal $T_1$ goes HIGH. At that time, multiplexer 200 selects its "1" input 210 for application to output 238 so that output 238 goes LOW, and signals appearing at juncture $A_1$, go LOW. Bit 1 toggle signal $T_1$ shortly thereafter (at time 210) shifts LOW to cause multiplexer 200 to select its "0" input 212 to apply to output 238. By that time, bit 1 count signal $Q_1$ is LOW so that signals appearing at juncture $A_1$ remain LOW. Operation of bit 1 counter cell $16_1$ continues in this manner until interrupted either by a clear signal CLR or some other event. Thus, bit 1 count signal $Q_1$ remains HIGH for substantially four time periods and LOW for substantially four time periods in alternating patterns in down-counting gray code counter 15.

Referring to FIG. 8b, signals appearing in bit counter cells $16_2$ and $16_3$ are illustrated. Bit counter cells $16_2$ and $16_3$ operate in the same manner as bit counter cells $16_0$ and $16_1$. The difference in signals within these respective bit counter cells $16_2$, $16_3$ occur because of different patterns of occurrence of bit toggle signals $T_2$, $T_3$. For example, bit 2 carry signal $C_2$ is provided to bit 2 counter cell $16_2$ via a line 32, which is the output of AND gate 206 in bit 1 counter cell $16_1$. Accordingly, bit 2 carry signal $C_2$ is HIGH only when bit 1 carry signal $C_1$ is HIGH and inverse bit 1 count signal $\overline{Q}_1$ is HIGH. Bit 2 toggle signal $T_2$ is provided to bit 2 counter cell $16_2$ via line 34, which is the output of AND gate 208 in bit 1 counter cell $16_1$. Accordingly, bit 2 toggle signal $T_2$ is HIGH only when bit 1 carry signal $C_1$ is HIGH and bit 1 count signal $Q_1$ is HIGH. Thus, the occurrence of bit 2 toggle signal $T_2$ as a HIGH signal is separated by eight time periods. The operation of bit 2 counter cell $16_2$ is the same as earlier described in connection with bit counter cells $16_0$, $16_1$. In the interest of avoiding prolixity, a detailed description of the signals occurring within bit 2 counter cell $16_2$ is not undertaken here. Of importance is the result that a HIGH state of bit 2 count signal $Q_2$ occurs every eight time periods for a duration of eight time periods.

FIG. 8b also illustrates timing signals within bit 3 counter cell $16_3$. Of particular interest in regard to bit 3 counter cell $16_3$ is that bit 3 toggle signal $T_3$ is provided to bit 3 counter cell $16_3$ via a line 42 which branches directly from input line 32 carrying bit 2 carry signal $C_2$. Thus, bit 3 toggle signal $T_3$ is the same signal as bit 2 carry signal $C_2$. Bit 3 carry signal $C_3$ is provided to bit 3 counter cell $16_3$ via input line 40, which is the output of AND gate 306. Thus, bit 3 carry signal $C_3$ is HIGH only when bit 2 carry signal $C_2$ is HIGH and inverse bit 2 count signal $Q_2$ is HIGH. The operation of bit 3 counter cell $16_3$ is the same as previously described in connection with the operation of bit counter cells $16_0$, $16_1$, $16_2$. The difference is that bit 3 toggle signal $T_3$ occurs differently in bit 3 counter cell $16_3$ than bit toggle signals $T_0$, $T_1$, $T_2$ occur in previously described bit counter cells $16_0$, $16_1$, $16_2$. In order to avoid prolixity, a detailed description of the operation of bit 3 counter cell $16_3$ will not be undertaken here. Bit 3 counter cell $16_3$ operates the same way that bit counter cells $16_0$, $16_1$ and $16_2$ operate. The occurrence patterns of bit 3 carry signal $C_3$ and bit 3 toggle signal $T_3$ differ from the occurrence patterns of analogous signals in the other bit counter cells $16_0$, $16_1$, $16_2$ because signals $C_3$, $T_3$ are outputs from AND gates 307 and 206, respectively. The important result of the counting action by bit 3 counter cell $16_3$ is that bit 3 count signal $Q_3$ is in a HIGH state for eight time periods separated by a LOW state for eight time periods.

A further relationship of importance among the bit counter cells $16_0$, $16_1$, $16_2$, $16_3$ is illustrated by inspection of FIGS. 8a, 8b. That is, the commencement of a HIGH portion of bit 1 count signal $Q_1$ occurs one time period following the commencement of a HIGH period of bit 0 count signal $Q_0$. Further, the commencement of a HIGH period of bit 2 count signal $Q_2$ occurs two time periods after commencement of a HIGH period of bit 1 count signal $Q_1$. Finally (this is where down-count gray code counter 15 differs from up-count gray code counter 11), the commencement of a HIGH portion of bit 3 count signal $Q_3$ occurs four time periods before (or, twelve time periods following) the commencement of a HIGH period for bit 2 output signal $Q_2$. Thus, the structure of down-count gray code counter 15 (FIG. 7) and the resulting operating signals (FIGS. 8a, 8b) reveal that in a given succession of instants in time, down-count gray code counter 15 counts as follows:

| Time | $Q_0$ | $Q_1$ | $Q_2$ | $Q_3$ |
|---|---|---|---|---|
| 24 | 0 | 0 | 0 | 1 |
| 25 | 1 | 0 | 0 | 1 |
| 26 | 1 | 1 | 0 | 1 |
| 27 | 0 | 1 | 0 | 1 |
| 28 | 0 | 1 | 1 | 1 |
| 29 | 1 | 1 | 1 | 1 |
| 210 | 1 | 0 | 1 | 1 |
| 211 | 0 | 0 | 1 | 1 |
| 212 | 0 | 0 | 1 | 0 |
| 213 | 1 | 0 | 1 | 0 |
| 214 | 1 | 1 | 1 | 0 |
| 215 | 0 | 1 | 1 | 0 |
| 216 | 0 | 1 | 0 | 0 |
| 217 | 1 | 1 | 0 | 0 |
| 218 | 1 | 0 | 0 | 0 |
| 219 | 0 | 0 | 0 | 0 |
| 220 | 0 | 0 | 0 | 1 |
| 221 | 1 | 0 | 0 | 1 |
| 222 | 1 | 1 | 0 | 1 |

This is a down-count routine appropriate to a gray code counter wherein only one bit changes at a time. The count repeats after four bits ($2^4 = 16$ counts) for this 4-bit down counter.

Figure 9:
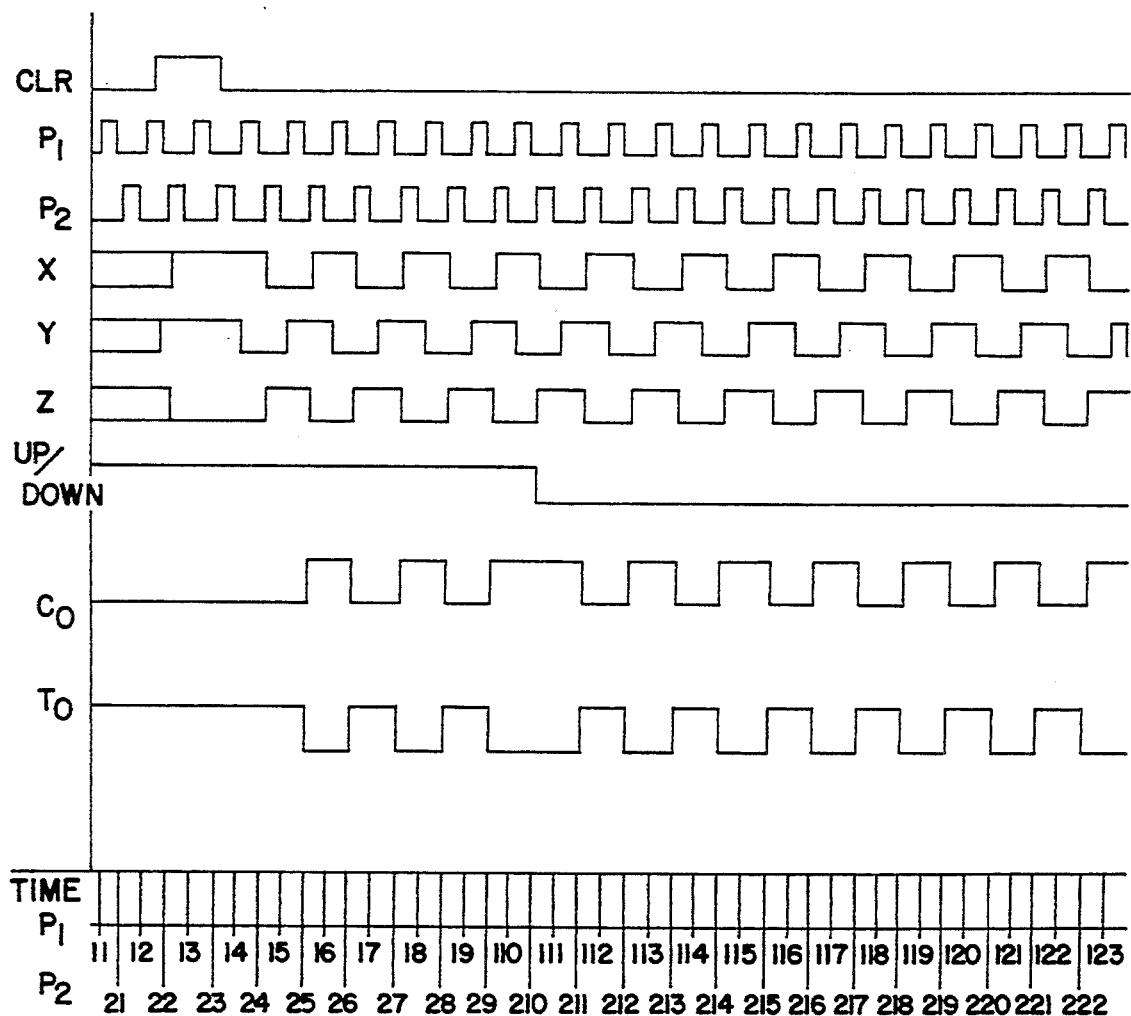
FIG. 9 is a timing signal diagram relating to the operation of the toggle circuit of FIG. 2, and relating to the up/down count control circuit of FIG. 3.

FIG. 9 is a timing signal diagram relating to the operation of the toggle circuit of FIG. 2, and relating to the up/down counter control circuit of FIG. 3.

In FIG. 9, a clear signal CLR and clocking signals $\theta_1$, $\theta_2$ are illustrated. Also shown in FIG. 9 are signals appearing at juncture locations in toggle circuit 12 (FIG. 2): juncture X (adjacent switching transistor 62), juncture Y (adjacent switching transistor 64), and juncture Z at output line 20 from inverter 60. Referring to FIGS. 2 and 9, before the cessation of clear signal CLR (at time 23), switching transistor 63 is gated by clear signal CLR and grounds juncture 61 so that juncture 61 is LOW. Signals appearing at juncture Y are HIGH because of the inverter associated with latch 56. Accordingly, signals appearing at juncture Z are LOW because of the inverter associated with latch 58 intermediate juncture Y and juncture Z. As a result, juncture X is HIGH (because of inverter 60).

Clocking signal $\theta_1$ gates switching transistor 62 at time 14 and juncture 61 goes HIGH. Consequently, because of the inverter associated with latch 56, juncture Y goes LOW at time 14. At time 24, clocking signal $\theta_2$ gates switching transistor 64 which drives juncture Z HIGH and, consequently, through inverter 60 and feedback line 65, drives juncture X LOW. Pulsing of clocking signal $\theta_1$ at time 15 gates switching transistor 62 which results in juncture Y going HIGH. Subsequent gating of switching transistor 64 by clocking signal $\theta_2$ drives juncture Z LOW and, consequently, drives juncture X HIGH.

Signals appearing at juncture Z represent inverse toggle signal $\overline{Q}$ generated at output line 22 of toggle circuit 12 (FIG. 2). Signals appearing at juncture X represent toggle signal Q generated at output line 20 of toggle circuit 12. Toggle circuit 12 continues to present toggle signal Q and inverse toggle signal $\overline{Q}$ 180° out of phase until interrupted by clear signal CLR or some other event.

Also presented in FIG. 9 are count control signal UP/DOWN, bit 0 carry signal $C_0$, and bit 0 toggle signal $T_0$, Referring to FIGS. 3 and 9, count control signal UP/DOWN is received at input 18 to up/down counter control circuit 14. Bit 0 carry signal $C_0$ is generated on output line 24 and bit 0 toggle signal $T_0$ is generated on output line 26. As illustrated in FIG. 1, when count control signal UP/DOWN is HIGH, following the cessation of clear signal CLR (at time 23), count control signal UP/DOWN is applied directly to the inverting trigger input 90 of multiplexer 72 and the non-inverting trigger input 80 of multiplexer 70 and its inverse is applied (via inverter 74) to non-inverting trigger input 88 of multiplexer 72 and inverting trigger input 82 of multiplexer 70.

Toggle signal Q is applied to the "0" input 86 of multiplexer 72 and to the "0" input 78 of multiplexer 70. Inverse toggle signal $\overline{Q}$ is applied to the "1" input 84 of multiplexer 72 and to the "1" input 76 of multiplexer 70.

Thus, so long as count control signal UP/DOWN is HIGH, multiplexer 70 will select its output $T_0$ from its "1" input 76, and multiplexer 88 will select its output $C_0$ from its "0" input 86. Accordingly, when count control signal UP/DOWN is HIGH, bit 0 carry signal $C_0$ will conform to toggle signal Q and bit 0 toggle signal $T_0$ will conform to inverse toggle signal $\overline{Q}$. When count control signal UP/DOWN goes LOW (as at time 210 in FIG. 9), multiplexer 70 selects its output $T_0$ from its "0" input 78, and multiplexer 88 selects its output $C_0$ from its "1" input 84 so that bit 0 carry signal $C_0$ conforms to inverse toggle signal $\overline{Q}$ and bit 0 toggle signal $T_0$ conforms to toggle signal Q.

It is to be understood that, while the detailed drawings and specific examples given describe preferred embodiments of the invention, they are for the purpose of illustration only, that the apparatus of the invention is not limited to the precise details and conditions disclosed, and that various changes may be made therein without departing from the spirit of the invention which is defined by the following claims.

What is claimed is:

1. An apparatus for counting occurrences of a particular input during a plurality of succeeding periods; the apparatus comprising:

an input terminal for receiving said input;

a toggle signal generating circuit for generating at least one periodic toggle signal to mark said plurality of periods; and a plurality of n counter cell circuits for effecting said counting in n bits; each respective counter cell circuit of said plurality of counter cell circuits generating at least a respective bit output, a respective toggle output, and a respective carry output; said plurality of counter cell circuits being arranged in hierarchical order from a least-significant counter cell circuit for counting a least-significant bit to a most-significant counter cell circuit for counting a most-significant bit; each said respective counter cell circuit being coupled with the next-most-significant counter cell circuit of said plurality of counter cell circuits and providing said respective toggle output to said next-most-significant counter cell circuit as a respective toggle input, and providing said respective carry output to said next-most-significant counter cell circuit as a respective carry input, except said most-significant counter cell circuit n receiving its respective toggle input from said respective carry output of the twice-less-significant counter cell circuit n-2;

the least-significant said respective counter cell circuit being coupled with said toggle signal generating circuit and receiving said at least one toggle signal from said toggle signal generating circuit as its respective toggle input and its respective carry input; said least-significant respective counter cell circuit being coupled with said input terminal and receiving said input.

2. An apparatus for counting occurrences of a particular input during a plurality of succeeding periods as recited in claim 1 wherein the apparatus further comprises a control circuit for determining whether the apparatus counts up or down in response to presence or absence of said input; said control circuit being coupled intermediate said toggle signal generating circuit and said input terminal, and said least-significant respective counter cell circuit; said control circuit receiving said input and said at least one periodic toggle signal and generating a first respective carry output and a first respective toggle output, said least-significant counter cell circuit receiving said first respective carry output as its respective carry input and receiving said first respective toggle output as its respective toggle input; said control circuit responding to said input to configure the apparatus for counting up or for counting down.

3. An apparatus for counting occurrences of a particular input during a plurality of succeeding periods as recited in claim 1 wherein each said respective counter cell circuit is of substantially the same structure.

4. An apparatus for counting occurrences of a particular input during a plurality of succeeding periods as recited in claim 2 wherein each said respective counter cell circuit is of substantially the same structure.

5. An apparatus for counting occurrences of a particular input during a plurality of succeeding periods as recited in claim 3 wherein the apparatus further comprises a clock circuit for establishing said plurality of periods; said clock circuit generating a plurality of non-overlapping clock signals; said clock circuit being coupled with said toggle signal generating circuit and with said plurality of n counter cell circuits.

6. An apparatus for counting occurrences of a particular input during a plurality of succeeding periods as recited in claim 5 wherein said structure comprises:

a multiplexer having a first multiplexer input conveying a first multiplexer input signal, a second multiplexer input conveying a second multiplexer input signal, and a multiplexer output conveying a multiplexer output signal; said multiplexer further having toggle input means for receiving said respective toggle input, said multiplexer responding to said respective toggle input to provide said first multiplexer input signal as said multiplexer output signal when said respective toggle input is at a first level and to provide said second multiplexer input signal as said multiplexer output signal when said respective toggle input is at a second level; and a latching delay circuit; said latching delay circuit including a first switching transistor coupled with said multiplexer output, a first inverting latch element coupled with said first switching transistor, a second switching transistor coupled with said first inverting latch element, a second inverting latch element coupled with said second switching transistor, and at least one inverter coupled with said second inverting latch element; said first switching transistor receiving said multiplexer output signal, said first switching transistor being gated by a first clock signal of said plurality of clock signals to pass said multiplexer output signal to said first inverting latch element; said first inverting latch element inverting said multiplexer output signal to generate a once-inverted signal, said once inverted signal being received by said second switching transistor, said second switching transistor being gated by a second clock signal of said plurality of clock signals to pass said once-inverted signal to said second inverting latch element; said second inverting latch element inverting said once-inverted signal to generate a twice-inverted signal, said twice-inverted signal being received by said at least one inverter; one signal among said twice-inverted signal and progeny-signal-outputs from said at least one inverter being a first-result signal; another signal among said twice-inverted signal and progeny-signal-outputs from said at least one inverter and being inverted with respect to said first-result signal being a second-result signal; said first-result signal being one of said first multiplexer input and said second multiplexer input, said second-result signal being the other of said first multiplexer input and said second multiplexer input; one of said first-result signal and said second-result signal being a bit-count signal output from said respective counter cell circuit.

7. An apparatus for counting occurrences of a particular input during a plurality of succeeding periods as recited in claim 6 wherein said configuration further comprises a first logic circuit for receiving said respective carry input and one of said first-result signal and said second-result signal, said first logic circuit generating said respective carry output.

8. An apparatus for counting occurrences of a particular input during a plurality of succeeding periods as recited in claim 7 wherein said configuration further comprises a second logic circuit for receiving said respective carry input and the other of said first-result signal and said second-result signal, said second logic circuit generating said respective toggle output.

9. An apparatus for counting occurrences of a particular input during a plurality of succeeding periods as recited in claim 4 wherein the apparatus further comprises a clock circuit for establishing said plurality of periods; said clock circuit generating a plurality of non-overlapping clock signals; said clock circuit being coupled with said toggle signal generating circuit and with said plurality of n counter cell circuits.

10. An apparatus for counting occurrences of a particular input during a plurality of succeeding periods as recited in claim 9 wherein said structure comprises:

a multiplexer having a first multiplexer input conveying a first multiplexer input signal, a second multiplexer input conveying a second multiplexer input signal, and a multiplexer output conveying a multiplexer output signal; said multiplexer further having toggle input means for receiving said respective toggle input, said multiplexer responding to said respective toggle input to provide said first multiplexer input signal as said multiplexer output signal when said respective toggle input is at a first level and to provide said second multiplexer input signal as said multiplexer output signal when said respective toggle input is at a second level; and a latching delay circuit; said latching delay circuit including a first switching transistor coupled with said multiplexer output, a first inverting latch element coupled with said first switching transistor, a second switching transistor coupled with said first inverting latch element, a second inverting latch element coupled with said second switching transistor, and at least one inverter coupled with said second inverting latch element; said first switching transistor receiving said multiplexer output signal, said first switching transistor being gated by a first clock signal of said plurality of clock signals to pass said multiplexer output signal to said first inverting latch element; said first inverting latch element inverting said multiplexer output signal to generate a once-inverted signal, said once inverted signal being received by said second switching transistor, said second switching transistor being gated by a second clock signal of said plurality of clock signals to pass said once-inverted signal to said second inverting latch element; said second inverting latch element inverting said once-inverted signal to generate a twice-inverted signal, said twice-inverted signal being received by said at least one inverter; one signal among said twice-inverted signal and progeny-signal-outputs from said at least one inverter being a first-result signal; another signal among said twice-inverted signal and progeny-signal-outputs from said at least one inverter and being inverted with respect to said first-result signal being a second-result signal; said first-result signal being one of said first multiplexer input and said second multiplexer input, said second-result signal being the other of said first multiplexer input and said second multiplexer input; one of said first-result signal and said second-result signal being a bit-count signal output from said respective counter cell circuit.

11. An apparatus for counting occurrences of a particular input during a plurality of succeeding periods as recited in claim 10 wherein said configuration further comprises a first logic circuit for receiving said respective carry input and one of said first-result signal and said second-result signal, said first logic circuit generating said respective carry output.

12. An apparatus for counting occurrences of a particular input during a plurality of succeeding periods as recited in claim 11 wherein said configuration further comprises a second logic circuit for receiving said respective carry input and the other of said first-result signal and said second-result signal, said second logic circuit generating said respective toggle output.

13. A modular counter apparatus for producing an n-bit count signal; the apparatus comprising:

a clock circuit for generating a plurality of clocking signals;

a toggle signal generating circuit coupled with said clock circuit and responsive to at least one clocking signal of said plurality of clocking signals to generate at least one periodic toggle signal; and a plurality of n counter cell circuits; each respective counter cell circuit of said plurality of counter cell circuits generating at least a respective bit output, a respective toggle output, and a respective carry output; said plurality of counter cell circuits being arranged in hierarchical order from a least-significant counter cell circuit for counting a least-significant bit to a most-significant counter cell circuit for counting a most-significant bit; each said respective counter cell circuit being coupled with the next-most-significant counter cell circuit of said plurality of counter cell circuits and providing said respective toggle output to said next-most-significant counter cell circuit as a respective toggle input, and providing said respective carry output to said next-most-significant counter cell circuit as a respective carry input, except said most-significant counter cell circuit n receiving its respective toggle input from said respective carry output of the twice-less-significant counter cell circuit n-2;

the least-significant said respective counter cell circuit being coupled with said toggle signal generating circuit and receiving said at least one toggle signal from said toggle signal generating circuit as its respective toggle input and its respective carry input.

* * * * *